United States Patent
Sato et al.

(10) Patent No.: US 9,560,794 B2
(45) Date of Patent: Jan. 31, 2017

(54) COOLING DEVICE FOR COOLING RACK-TYPE SERVER, AND DATA CENTER PROVIDED WITH SAME

(71) Applicant: Panasonic Corporation, Osaka (JP)

(72) Inventors: Kaoru Sato, Aichi (JP); Makoto Sugiyama, Aichi (JP); Wakana Nogami, Aichi (JP); Shunji Miyake, Aichi (JP); Ayaka Suzuki, Aichi (JP); Mutsuhiko Matsumoto, Aichi (JP); Masafumi Matsui, Aichi (JP); Hiroshi Shibata, Aichi (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 263 days.

(21) Appl. No.: 14/353,291

(22) PCT Filed: Oct. 30, 2012

(86) PCT No.: PCT/JP2012/006946
§ 371 (c)(1),
(2) Date: Apr. 22, 2014

(87) PCT Pub. No.: WO2013/069226
PCT Pub. Date: May 16, 2013

(65) Prior Publication Data
US 2014/0321050 A1    Oct. 30, 2014

(30) Foreign Application Priority Data
Nov. 8, 2011    (JP) ................. 2011-244236

(51) Int. Cl.
*H05K 7/20*    (2006.01)
*G06F 1/20*    (2006.01)

(52) U.S. Cl.
CPC ............ *H05K 7/20818* (2013.01); *G06F 1/20* (2013.01); *H05K 7/20745* (2013.01); *H05K 7/20754* (2013.01); *G06F 2200/201* (2013.01)

(58) Field of Classification Search
CPC ............ H05K 7/20818; H05K 7/20754; H05K 7/20745; G06F 1/20; G06F 2200/201
See application file for complete search history.

(56) References Cited

U.S. PATENT DOCUMENTS

| | | | |
|---|---|---|---|
| 5,731,954 | A | 3/1998 | Cheon |
| 7,233,491 | B2 | 6/2007 | Faneuf et al. |

(Continued)

FOREIGN PATENT DOCUMENTS

| | | |
|---|---|---|
| CN | 101815423 | 8/2010 |
| CN | 102149627 | 8/2011 |

(Continued)

OTHER PUBLICATIONS

English Translation of Chinese Search Report dated Sep. 30, 2015 for the related Chinese Patent Application No. 201380053584.8.

(Continued)

*Primary Examiner* — Emmanuel Duke
(74) *Attorney, Agent, or Firm* — Panasonic IP Management; Kerry S. Culpepper (57) ABSTRACT

A cooling device for cooling a rack-type server of which a housing includes a plurality of electronic devices includes an interior cooling unit and an exterior cooling unit. The interior cooling unit includes a heat-receiving unit, a heat dissipation unit, an outward path pipe, and a return path pipe. The interior cooling unit allows working fluid to be circulated through the heat-receiving unit, the outward path pipe, the heat dissipation unit, the return path pipe, and the heat-receiving unit to thereby move the heat from the heat-receiving unit to the heat dissipation unit. The exterior cooling unit has a heat exchange unit abutted on the heat dissipation unit and allows, by a circulated cooling medium, (Continued)

the heat of the working fluid discharged from the heat dissipation unit to be dissipated to external air.

11 Claims, 12 Drawing Sheets

(56) References Cited

U.S. PATENT DOCUMENTS

| | | |
|---|---|---|
| 2003/0000721 A1* | 1/2003 | Garner ............... H05K 7/20681 174/50 |
| 2003/0057546 A1 | 3/2003 | Memory et al. |
| 2004/0057211 A1* | 3/2004 | Kondo ...................... G06F 1/20 361/696 |
| 2005/0045309 A1 | 3/2005 | Kondo et al. |
| 2005/0247432 A1* | 11/2005 | Bhatti ................ F28D 15/0233 165/80.3 |
| 2006/0162898 A1 | 7/2006 | Reyzin et al. |
| 2006/0196640 A1 | 9/2006 | Siu |
| 2009/0084525 A1 | 4/2009 | Satou et al. |
| 2009/0133861 A1* | 5/2009 | Kim .......................... F24H 1/48 165/140 |
| 2010/0018678 A1 | 1/2010 | Siu |
| 2010/0027216 A1 | 2/2010 | Matsushima et al. |
| 2010/0277863 A1 | 11/2010 | Tozer et al. |
| 2011/0248035 A1 | 10/2011 | Peirsman et al. |
| 2012/0106073 A1* | 5/2012 | Wu .................... H05K 7/20827 361/679.52 |
| 2012/0134678 A1 | 5/2012 | Roesner et al. |
| 2012/0180993 A1 | 7/2012 | Yoshikawa |
| 2013/0063896 A1 | 3/2013 | Satou et al. |
| 2015/0136362 A1 | 5/2015 | Yoshikawa |

FOREIGN PATENT DOCUMENTS

| | | | |
|---|---|---|---|
| JP | 04-117483 U | | 10/1992 |
| JP | 09125891 A | * | 5/1997 |
| JP | 2003-179375 | | 6/2003 |
| JP | 2004-363308 | | 12/2004 |
| JP | 2004363308 A | * | 12/2004 |
| JP | 2005-079483 | | 3/2005 |
| JP | 2005-249258 | | 9/2005 |
| JP | 2005249258 A | * | 9/2005 |
| JP | 2008-522129 | | 6/2008 |
| JP | 2009-088127 | | 4/2009 |
| JP | 2010-032174 | | 2/2010 |
| WO | 2011/040129 | | 4/2011 |
| WO | 2011/081620 | | 7/2011 |

OTHER PUBLICATIONS

International Search Report of PCT Application No. PCT/JP2012/006946 dated Oct. 30, 2012.

* cited by examiner

FIG. 12

COOLING DEVICE FOR COOLING RACK-TYPE SERVER, AND DATA CENTER PROVIDED WITH SAME

TECHNICAL FIELD

The present invention relates to a cooling device for cooling a rack-type server, and a data center provided with the same.

BACKGROUND ART

In recent years, with electronic components having a higher performance and control substrates having a higher density, a remarkably-increased amount of heat has been emitted from control substrates. Furthermore, more electronic components for example have been provided to have a smaller size, a higher integration and a higher amount of information to be processed. Thus, an efficient cooling is required in the vicinity of a heat-generating unit. Thus, a cooling system has been suggested to cool a rack-type server using a water-cooling jacket (see for example Patent Publication 1).

The following section will describe a conventional cooling system to cool a rack-type server. A cabinet constituting an electronic device includes a plurality of electronic devices to form a plurality of stages. One electronic device accommodates a Central Processing Unit (CPU) as a semiconductor device from which heat is generated. This CPU is cooled by liquid circulated by the first pump in the first cooling system.

This first cooling system is thermally connected to the second cooling system having the second pump attached to the rear side of the cabinet. This second pump is connected to a piping. This piping is inserted to the interior of each electronic device of each stage. The piping raised from the second pump to be parallel to the cabinet is abutted on an inner wall face of the cabinet.

The piping inserted to the interior of each electronic device is attached with two heat-receiving units among which one heat-receiving unit is thermally connected to the heat-receiving jacket of the first cooling system and the other heat-receiving unit is thermally connected to a heat exchanger. The cooling liquid discharged from the second pump is circulated through the respective electronic devices of the respective stages and is subsequently collected by the second pump.

By the above configuration, the heat generated from the CPUs of the respective electronic devices is transmitted via the piping to the cabinet. Then, the heat is naturally released in the entire cabinet or is forcedly discharged by a cooling fan provided in the cabinet.

In the case of the conventional cooling system as described above, a disadvantage was caused in that the first cooling system cooled by water requires each electronic device to have the first pump for water circulation, thus causing increased power consumption. Furthermore, the heat from the heat-generating body (CPU) is finally discharged to the exterior of the cabinet, thus causing a disadvantage in an increased temperature in a place whether the cabinet is provided.

PRIOR ART PUBLICATION

Patent Publication

[Patent Publication 1] Japanese Patent Unexamined Publication No. 2005-79483

SUMMARY OF THE INVENTION

The present invention provides a cooling device for cooling a rack-type server of which a housing includes a plurality of electronic devices having electronic components. The cooling device includes an interior cooling unit and an exterior cooling unit. The interior cooling unit includes: a heat-receiving unit that transmits heat from the electronic components to working fluid; a heat dissipation unit that dissipates heat of the working fluid; and an outward path pipe and a return path pipe connecting the heat-receiving unit to the heat dissipation unit. A circulation path is formed in which the working fluid is circulated through the heat-receiving unit, the outward path pipe, the heat dissipation unit, and the return path pipe. A part of the circulation path from the heat dissipation unit to the heat-receiving unit has a check valve. The working fluid is circulated through the circulation path to move the heat of the heat-receiving unit to the heat dissipation unit. The exterior cooling unit has a heat exchange unit abutted on the heat dissipation unit and allows, by a circulated cooling medium, the heat of the working fluid to be dissipated from the heat dissipation unit to external air.

The cooling device for cooling a rack-type server having the configuration as described above requires no pump to circulate the working fluid. The reason is that the interior cooling unit uses the heat generated from the electronic components as a power source to circulate working fluid. This consequently requires a small amount of power consumption for cooling. Furthermore, the heat from the electronic components is dissipated to external air, thus avoiding an increased temperature in a place where the electronic devices are provided.

DESCRIPTION OF EMBODIMENTS

The following section will describe an embodiment of the present invention with reference to the drawings.

Embodiment 1

Figure 1:
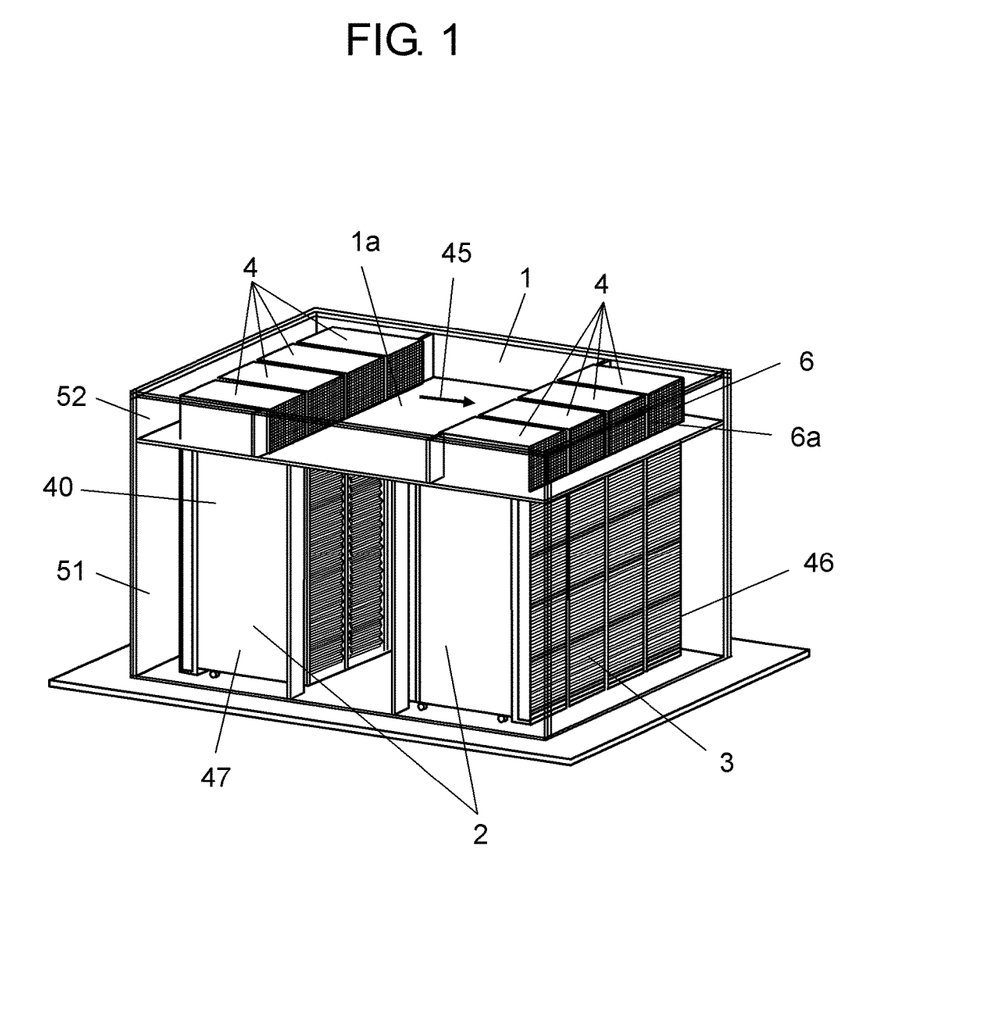
FIG. 1 is a schematic view illustrating a data center including a cooling device for cooling a rack-type server of Embodiment 1 of the present invention.

FIG. 1 is a schematic view illustrating a data center including a cooling device for cooling a rack-type server of Embodiment 1 of the present invention. As shown in FIG. 1, data center 1 includes rack-type servers 2. Rack-type server 2 has housing 40 in which front face side 47 and rear face side 46 include openings. Rack-type server 2 is configured so that housing 40 includes therein electronic devices 3. An operation panel or display unit (not shown) is provided to face front face side 47 of housing 40.

Rear face side 46 of housing 40 has a wiring or power wire for example (not shown) for the connection between electronic devices 3 or for the connection with an external device. All of electronic devices 3 do not always include an operation panel or a display unit. Rack-type servers 2 are provided in data center 1. Data center 1 also may be called as an electronic calculation room or a server room for example.

Figure 2A:
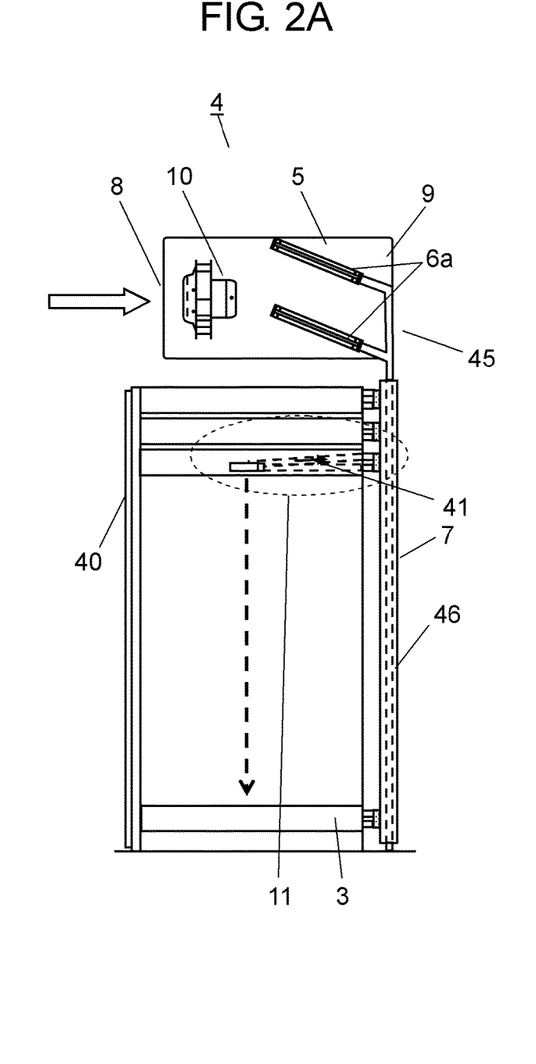
FIG. 2A is a side view illustrating the cooling device for cooling a rack-type server.
Figure 2B:
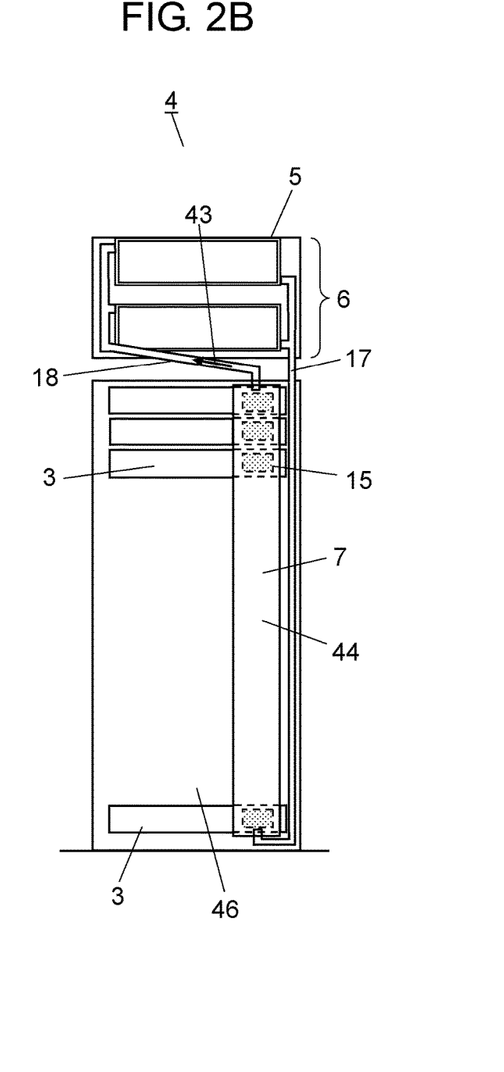
FIG. 2B is a rear view illustrating the cooling device for cooling a rack-type server.

FIG. 2A is a side view illustrating the cooling device for cooling a rack-type server of Embodiment 1 of the present invention. FIG. 2B is a rear view illustrating the cooling device for cooling a rack-type server. As shown in FIG. 2A and FIG. 2B, cooling device 4 for cooling rack-type server 2 comprises exterior cooling unit 5 and interior cooling unit 11. Flat plate-like evaporator unit 7 is provided so as to cover a part of rear face side 46 of housing 40. Condenser unit 6 having a box-like shape includes therein flat plate-like condensers 6a and air blower 10. Condenser unit 6 has external air suction port 8 functioning as a ventilation opening and external air airflow outlet 9. As shown in FIG. 1, ceiling 1a of data center 1 has condenser unit 6 of exterior cooling unit 5.

Figure 3:
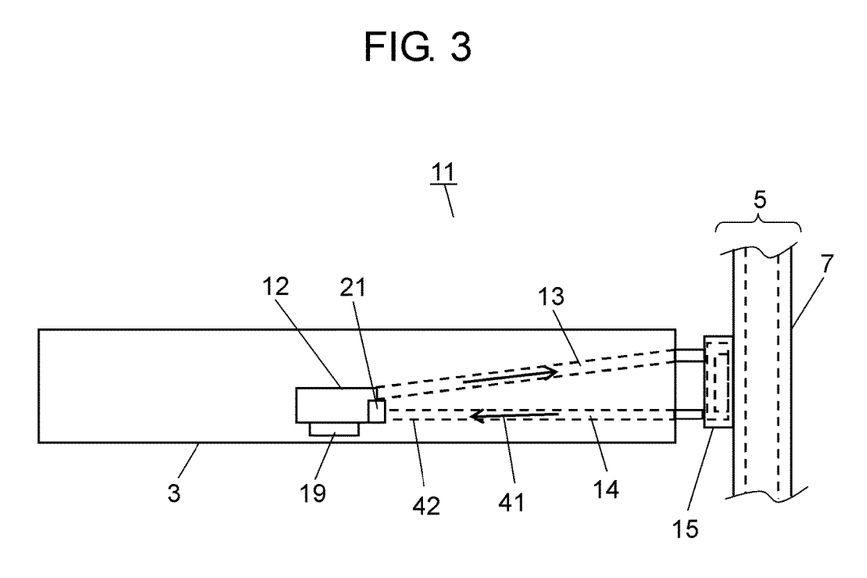
FIG. 3 is a detailed side view illustrating the cooling device for cooling a rack-type server.

FIG. 3 is a detailed side view illustrating the cooling device for cooling a rack-type server of Embodiment 1 of the present invention. As shown in FIG. 3, interior cooling unit 11 is configured so that heat-receiving unit 12, outward path pipe 13, and return path pipe 14 are provided in each electronic device 3. Heat dissipation unit 15 is provided to be abutted on evaporator unit 7 of exterior cooling unit 5 provided at the exterior of each electronic device 3. Outward path pipe 13 and return path pipe 14 connect heat-receiving unit 12 to heat dissipation unit 15.

Heat-receiving unit 12, outward path pipe 13, heat dissipation unit 15, and return path pipe 14 are connected in this order to form circulation path 42 in which working fluid 41 is circulated to move the heat from heat-receiving unit 12 to heat dissipation unit 15. Check valve 21 is provided at a connection side at which return path pipe 14 is connected to heat-receiving unit 12 (i.e., check valve 21 is provided in a part of circulation path 42 from heat dissipation unit 15 to heat-receiving unit 12).

The atmosphere in circulation path 42 is determined by working fluid 41 to be used. When working fluid 41 is water for example, the atmosphere in circulation path 42 is generally set to be lower than the atmospheric pressure.

The following section will describe the detailed configurations of the respective parts.

Heat-receiving unit 12 has a box-like shape. The bottom face of heat-receiving unit 12 is attached to electronic component 19 (e.g., a Central Processing Unit (CPU)) so that thermal conduction therebetween is possible. The upper part or the side face of heat-receiving unit 12 is connected to one ends of outward path pipe 13 and return path pipe 14. Heat-receiving unit 12 transmits the heat from electronic component 19 to working fluid 41.

Figure 4A:
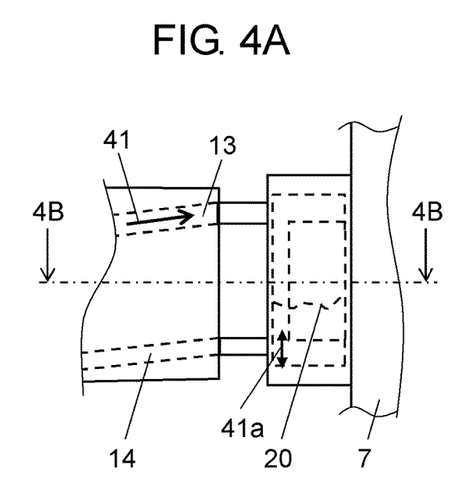
FIG. 4A is a detailed partial side view illustrating a heat dissipation unit of the cooling device for cooling a rack-type server.
Figure 4B:
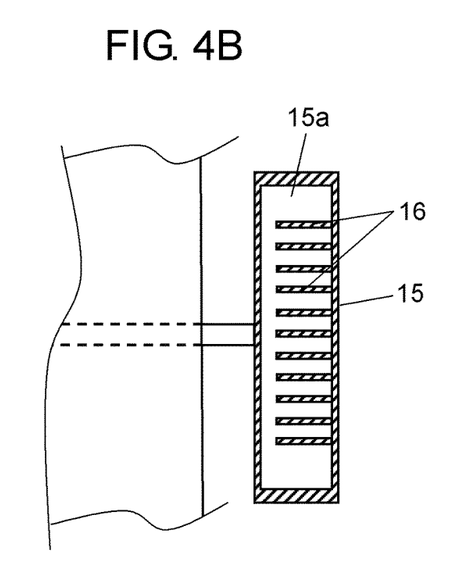
FIG. 4B is a cross-sectional view taken along 4B-4B in FIG. 4A.
Figure 4C:
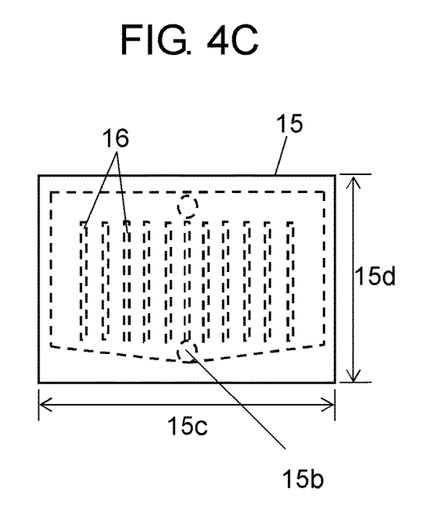
FIG. 4C is a front view illustrating the heat dissipation unit of the cooling device for cooling a rack-type server of Embodiment 1 of the present invention.

FIG. 4A is a detailed partial side view illustrating a heat dissipation unit of the cooling device for cooling a rack-type server of Embodiment 1 of the present invention. FIG. 4B is a cross-sectional view taken along 4B-4B in FIG. 4A. FIG. 4C is a front view illustrating the heat dissipation unit of the cooling device for cooling a rack-type server of Embodiment 1 of the present invention. As shown in FIG. 4A to FIG. 4C, heat dissipation unit 15 for dissipating the heat of working fluid 41 has a rectangular parallelepiped-like shape. Heat dissipation unit 15 includes therein heat dissipation fins 16 (11 heat dissipation fins 16 in FIG. 4B and FIG. 4C) abutted on the side face of evaporator unit 7.

Heat dissipation unit 15 is configured so that horizontal width 15c in a horizontal direction (longitudinal direction) is larger than vertical height 15d in a vertical direction. The upper part of heat dissipation unit 15 is connected to one end of outward path pipe 13. The lower part of heat dissipation unit 15 is connected to one end of return path pipe 14.

Figure 5A:
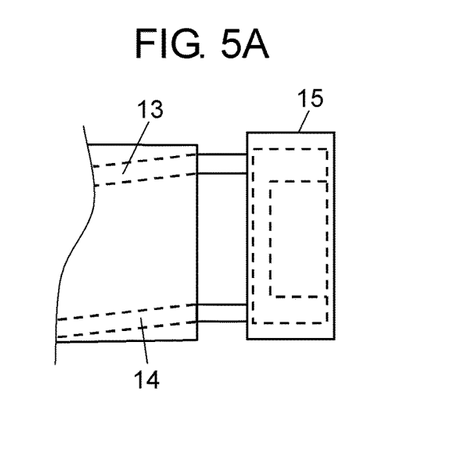
FIG. 5A is a side view illustrating another example 1 of the heat dissipation unit of the cooling device for cooling a rack-type server.
Figure 5B:
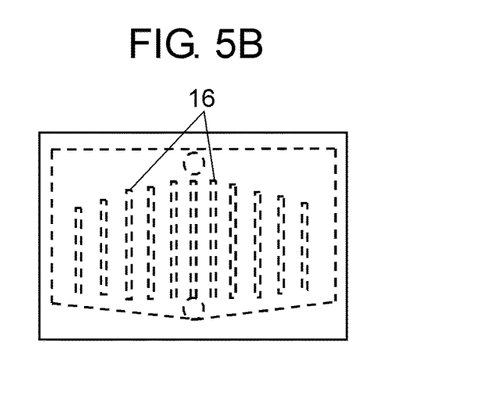
FIG. 5B is a front view illustrating another example 1 of the heat dissipation unit of the cooling device for cooling a rack-type server.
Figure 5C:
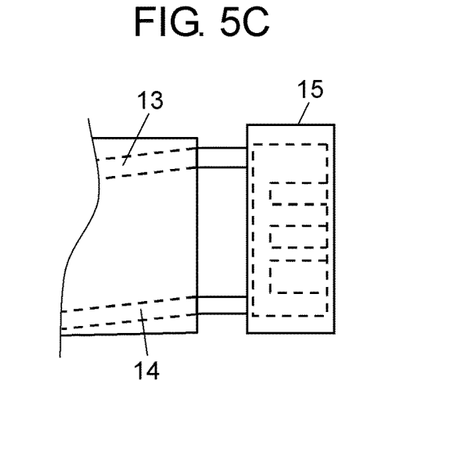
FIG. 5C is a side view illustrating another example 2 of the heat dissipation unit of the cooling device for cooling a rack-type server.
Figure 5D:
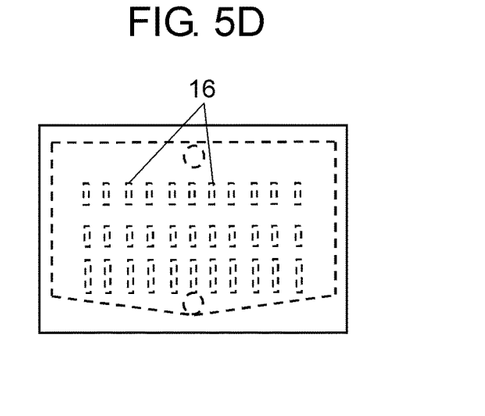
FIG. 5D is a front view illustrating another example 2 of the heat dissipation unit of the cooling device for cooling a rack-type server.
Figure 5E:
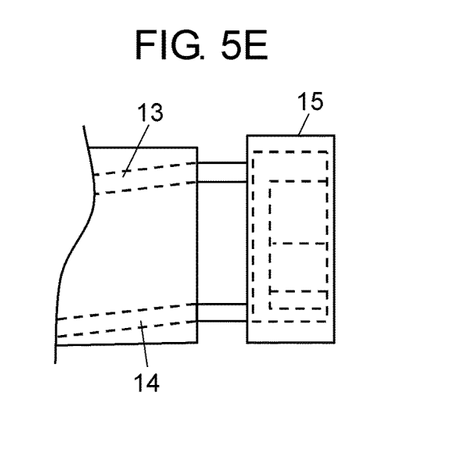
FIG. 5E is a side view illustrating another example 3 of the heat dissipation unit of the cooling device for cooling a rack-type server.
Figure 5F:
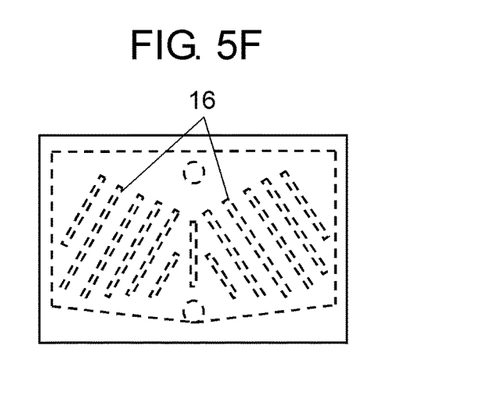
FIG. 5F is a front view illustrating another example 3 of the heat dissipation unit of the cooling device for cooling a rack-type server.

FIG. 5A is a side view illustrating another example 1 of the heat dissipation unit of the cooling device for cooling a rack-type server of Embodiment 1 of the present invention. FIG. 5B is a front view illustrating another example 1 of the heat dissipation unit of the cooling device for cooling a rack-type server of Embodiment 1 of the present invention. FIG. 5C is a side view illustrating another example 2 of the heat dissipation unit of the cooling device for cooling a rack-type server of Embodiment 1 of the present invention. FIG. 5D is a front view illustrating another example 2 of the heat dissipation unit of the cooling device for cooling a rack-type server of Embodiment 1 of the present invention. FIG. 5E is a side view illustrating another example 3 of the heat dissipation unit of the cooling device for cooling a rack-type server of Embodiment 1 of the present invention. FIG. 5F is a front view illustrating another example 3 of the heat dissipation unit of the cooling device for cooling a rack-type server. FIG. 5A to FIG. 5F illustrate three examples different in the shape and arrangement of heat dissipation fin 16 to promote the heat dissipation effect.

Figure 6A:
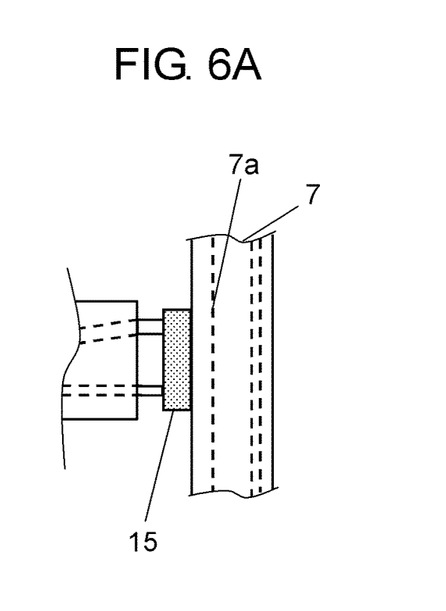
FIG. 6A is a side view illustrating an exterior cooling unit of the cooling device for cooling a rack-type server.
Figure 6B:
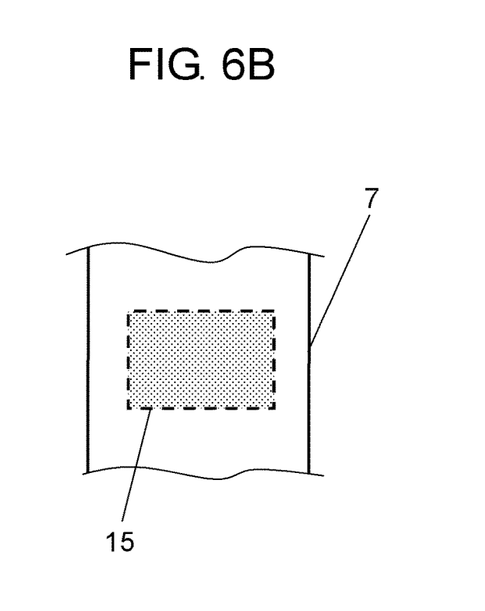
FIG. 6B is a detailed rear view illustrating the heat dissipation unit of the cooling device for cooling a rack-type server.

FIG. 6A is a side view illustrating the exterior cooling unit of the cooling device for cooling a rack-type server of Embodiment 1 of the present invention. FIG. 6B is a detailed rear view illustrating the heat dissipation unit of the cooling device for cooling a rack-type server. As shown in FIG. 2A, FIG. 2B, and FIG. 6A, exterior cooling unit 5 comprises condenser unit 6, evaporator unit 7 functioning as heat exchange unit 44, liquid pipe 17, and vapor tubing 18. Condenser unit 6 includes therein condenser 6a. Evaporator unit 7 includes therein heat-receiving plate 7a. Liquid pipe 17 and vapor tubing 18 connect condenser unit 6 and evaporator unit 7. Cooling medium 43, which is chlorofluorocarbon-base for example, is circulated through evaporator unit 7, vapor tubing 18, condenser unit 6, and liquid pipe 17 to provide heat transfer.

Figure 7A:
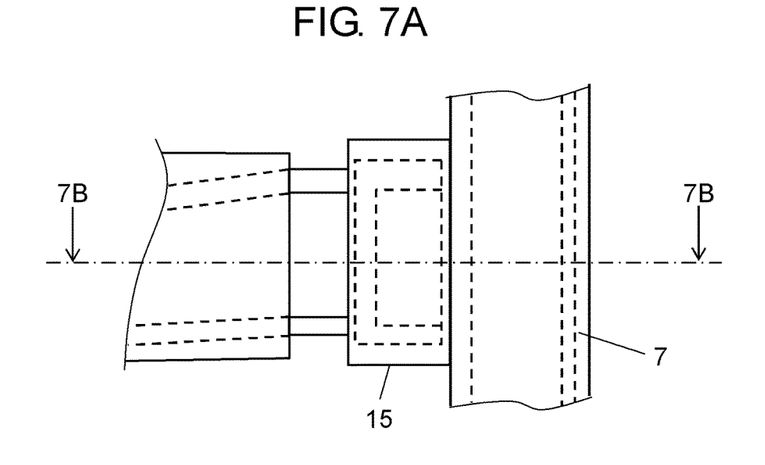
FIG. 7A is a side view illustrating the heat dissipation unit and an evaporator unit of the cooling device for cooling a rack-type server.
Figure 7B:
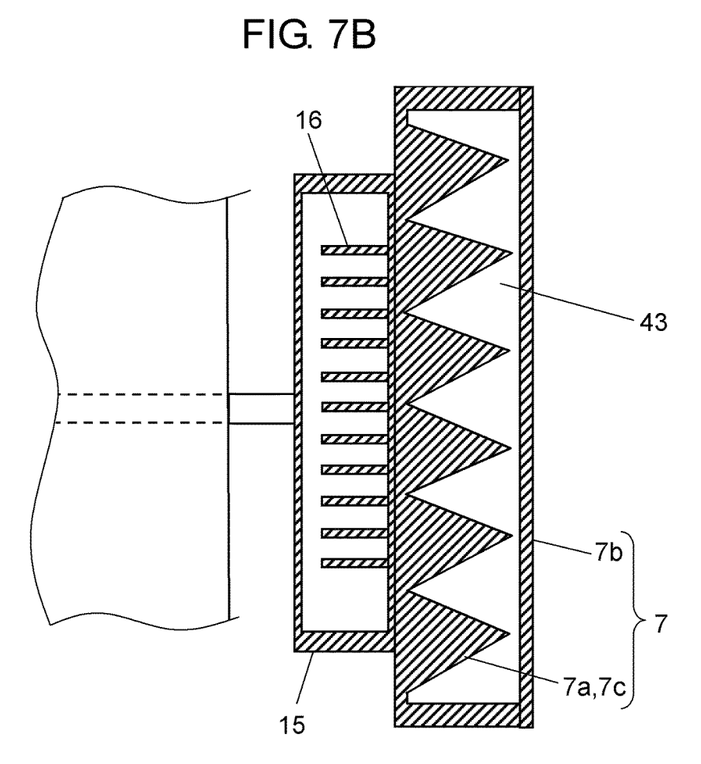
FIG. 7B is a cross-sectional view taken along 7B-7B of FIG. 7A.

FIG. 7A is a side view illustrating the heat dissipation unit and the evaporator unit of the cooling device for cooling a rack-type server of Embodiment 1 of the present invention. FIG. 7B is a cross-sectional view taken along 7B-7B in FIG. 7A. As shown in FIG. 7A and FIG. 7B, evaporator unit 7 comprises heat-receiving plate 7a and heat-receiving cover 7b. Heat-receiving plate 7a is configured so that surface 7c at an opposite side of heat dissipation unit 15 has a convexoconcave shape. Cooling medium 43 passes by the space between the convexoconcave section of heat-receiving plate 7a and heat-receiving cover 7b.

With regard to the above configuration, how to cool electronic component 19 will be described firstly by way of interior cooling unit 11. As shown in FIG. 3, interior cooling unit 11 comprises heat-receiving unit 12, outward path pipe 13, heat dissipation unit 15, and return path pipe 14. Working fluid 41 (e.g., water) flows in interior cooling unit 11. During a normal operation, water is stored up to liquid level 20 shown by the broken line in heat dissipation unit 15 of FIG. 4A.

When rack-type server 2 shown in FIG. 1 is activated, high current flows in electronic component 19, thus starting heat generation rapidly. Then, the heat causes the water in heat-receiving unit 12 shown in FIG. 3 to be rapidly boiled and vaporized and the resultant vapor rushes into heat dissipation unit 15 via outward path pipe 13. During this, the existence of check valve 21 prevents the water in heat-receiving unit 12 from moving toward return path pipe 14.

As shown in FIG. 3 and FIG. 4B, heat dissipation unit 15 is provided while being abutted on evaporator unit 7 of exterior cooling unit 5. Thus, heat dissipation fin 16 provided in heat dissipation unit 15 has a temperature substantially equal to a room temperature. By allowing the vaporized water (i.e., water vapor) to contact with heat dissipation fin 16, the water vapor is cooled and the water vapor is consequently condensed and liquefied. The liquefied water remains in heat dissipation unit 15 to form liquid level 20 shown by the broken line in FIG. 4A. Under liquid level 20, one end of return path pipe 14 is opened. Above liquid level 20, the other end of outward path pipe 13 is opened.

As shown in FIG. 4A to FIG. 4C, heat dissipation unit 15 stores therein liquefied working fluid 41. Heat dissipation unit 15 has horizontal cross-sectional area 15a that is larger than orthogonal cross-sectional area 15b in direction 41a orthogonal to the circulation direction of working fluid 41 of return path pipe 14. By the configuration as described above, liquid level 20 existing in heat dissipation unit 15 has an area that is remarkably larger than orthogonal cross-sectional area 15b in direction 41a orthogonal to the circulation direction of working fluid 41 in return path pipe 14. As a result, interior cooling unit 11 has a reduced height.

The reason is that, in order to reach the hydraulic head pressure for opening check valve 21, return path pipe 14 connected to check valve 21 must be positioned high. However, in Embodiment 1, if heat dissipation unit 15 has a lateral width of 4 centimeters and a longitudinal width of 15 centimeters for example, horizontal cross-sectional area 15a as an area of liquid level 20 in heat dissipation unit 15 can be easily increased to be 100 times larger than orthogonal cross-sectional area 15b of direction 41a orthogonal to the circulation direction of working fluid 41 of return path pipe 14 (having an inner diameter cross-sectional area of 0.6 $cm^2$). In this configuration, a required hydraulic head pressure height may be a few centimeters.

Specifically, liquid level 20 in heat dissipation unit 15 having horizontal cross-sectional area 15a in heat dissipation unit 15 is configured so that horizontal cross-sectional area 15a entirely receives the pressure from outward path pipe 13. As a result, even when the water head height for opening check valve 21 is low, check valve 21 can be opened and working fluid 41 can be again circulated into heat-receiving unit 12 to continue cooling.

Specifically, in Embodiment 1, the water head height for opening check valve 21 can be reduced to thereby provide an extremely-low product height that can be applied to the cooling of rack-type server 2.

Heat dissipation fin 16 prevents the short circuit of the vapor from the connecting port of outward path pipe 13 to the connecting port of return path pipe 14 to thereby promote a heat dissipation effect. Thus, as shown in FIG. 5A to FIG. 5F, heat dissipation fin 16 has improved shape and layout.

In FIG. 5A and FIG. 5B, heat dissipation fin 16 has such a height that is increasingly reduced toward the connecting port of outward path pipe 13. In FIG. 5C and FIG. 5D, the respective fins of heat dissipation fin 16 are divided and spaced in the height direction. In FIG. 5E and FIG. 5F, a space is provided between the connecting port of outward path pipe 13 and the highest part of each heat dissipation fin 16. Heat dissipation fins 16 except for the center one are all arranged in an inclined manner to be symmetric in the left-and-right direction.

This configuration allows, in contrast with the shape of heat dissipation fin 16 of FIG. 4B and FIG. 4C, the vapor to easily pass even fins provided away from the connecting port of outward path pipe 13, thus providing a more-efficient use of the respective fins of heat dissipation fin 16.

Next, the cooling action by exterior cooling unit 5 will be described. As shown in FIG. 3 and FIG. 4A to FIG. 4C and FIG. 6A, the heat generated from electronic component 19 is transmitted to heat-receiving unit 12 and is dissipated by heat dissipation fins 16 in an increased manner while moving from heat dissipation unit 15 of interior cooling unit 11 and is transmitted to heat-receiving plate 7a of evaporator unit 7.

As shown in FIG. 7B, heat-receiving plate 7a of evaporator unit 7 is fixed by a screw for example and is closely-attached to heat dissipation unit 15. The heat lost by heat dissipation fin 16 is efficiently transmitted to heat-receiving plate 7a.

Heat-receiving plate 7a has surface 7c opposite to heat dissipation unit 15 that has a convexoconcave shape. Cooling medium 43 passes through the space between the concave section of heat-receiving plate 7a and heat-receiving cover 7b. This consequently increases the area at which heat-receiving plate 7a contacts cooling medium 43. Thus, the heat transmitted to heat-receiving plate 7a is efficiently transmitted to cooling medium 43.

At this point of time, liquid cooling medium 43 is filled up to the highest position of evaporator unit 7 including liquid pipe 17. The heat transmitted to heat-receiving plate 7a causes liquid cooling medium 43 in evaporator unit 7 to evaporate. Then, cooling medium 43 is moved to condenser 6a via vapor tubing 18 shown in FIG. 2A and FIG. 2B.

Condenser unit 6 is configured to include condenser 6a and air blower 10 in a box in which openings (external air suction port 8 and external air airflow outlet 9) are formed so that ventilation can be made through faces opposing to each other. External air suction port 8 and external air airflow outlet 9 may have a grid-like configuration, punching configuration, or net-like configuration for example so long as the configuration can allow air to pass therethrough as in other ventilation openings. Condenser 6a is provided so as to receive air sent from air blower 10. In FIG. 2A, condenser 6a is provided while being inclined to the ventilation direction (arrow).

In condenser unit 6 placed in external air ventilation space 52 shown in FIG. 1, external air 45 passing therethrough cools and condenses cooling medium 43 of in condenser 6a shown in FIG. 2A and FIG. 2B. Liquefied cooling medium 43 goes down to evaporator unit 7 through liquid pipe 17.

As described above, exterior cooling unit 5 allows cooling medium 43 to be circulated through evaporator unit 7, vapor tubing 18, condenser 6a, and liquid pipe 17 to provide a thermosiphon cycle for heat transfer. Specifically, the heat of working fluid 41 discharged from heat dissipation unit 15 is dissipated to external air 45 by the circulation of cooling medium 43.

Members constituting cooling device 4 are preferably made of material such as aluminum, copper, or stainless in view of the heat conductivity and corrosion resistance because such members are used for a high heat generating body.

Embodiment 2

Figure 8:
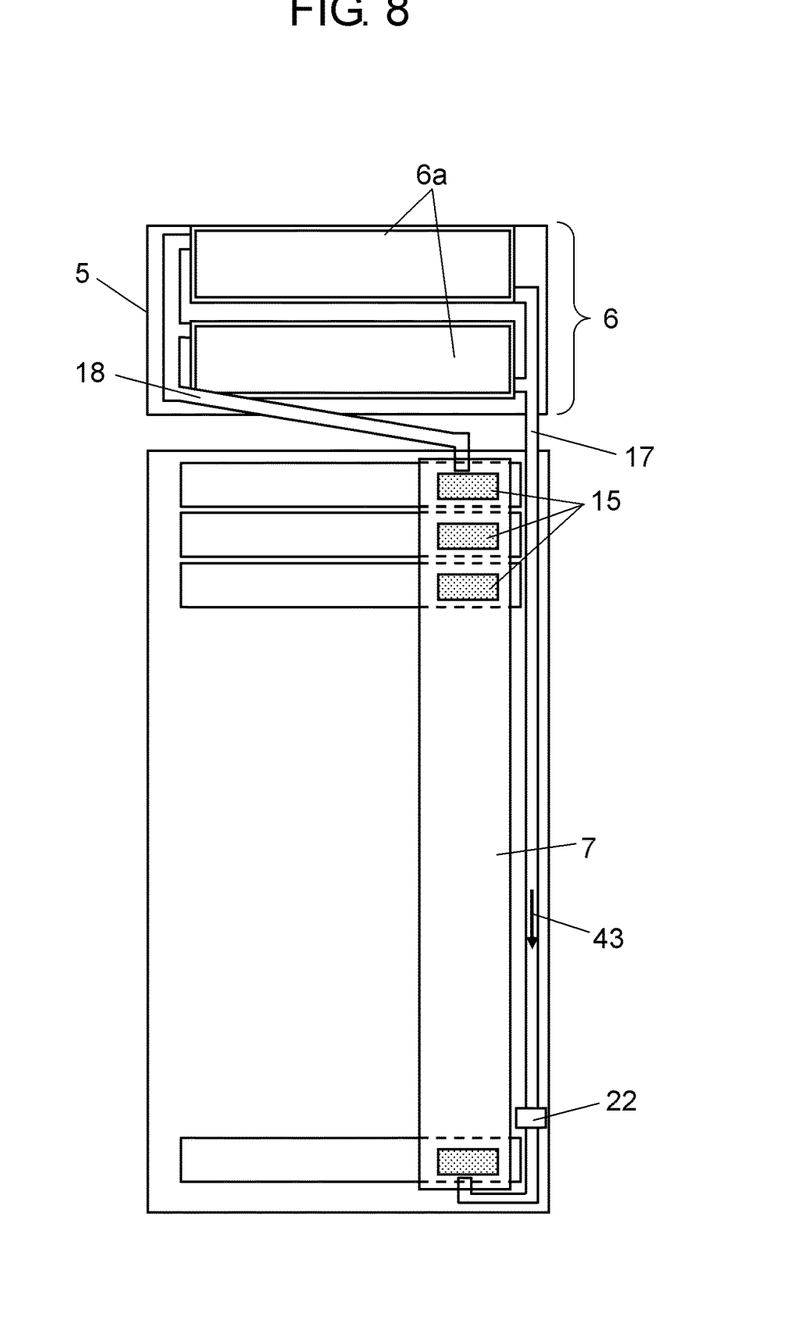
FIG. 8 is a rear view illustrating the cooling device for cooling a rack-type server of Embodiment 2 of the present invention.

FIG. 8 is a rear view illustrating a cooling device for cooling a rack-type server of Embodiment 2 of the present invention. In Embodiment 2 of the present invention, the same components as those of Embodiment 1 will be denoted with the same reference numerals and will not be described further except for the differences therebetween. As shown in FIG. 8, evaporator unit 7-side has check valve 22 in the middle of liquid pipe 17 of exterior cooling unit 5.

Check valve 22 prevents cooling medium 43 from returning from evaporator unit 7 to liquid pipe 17. Since cooling medium 43 is circulated in one fixed direction, a thermosiphon-type cooling medium circulation is stabilized.

As shown in FIG. 1, data center 1 is configured so that rack-type servers 2 are provided and cooling device 4 for cooling rack-type server 2 is provided. Data center 1 is divided into external air ventilation space 52 as an upper part and body space 51 as a lower part. Rack-type server 2 is placed in body space 51. Condenser 6a is placed in external air ventilation space 52.

As a result, the exhaust heat from condenser unit 6 is discharged to external air 45. This consequently prevents electronic device 3 from including therein an increased temperature due to exhaust heat.

As described above, cooling medium 43 and working fluid 41 are circulated both through exterior cooling unit 5 and interior cooling unit 11 due to a pressure difference. This eliminates the need for a pump for circulation. At the same time, the exhaust heat from condenser unit 6 is discharged to external air 45. This consequently prevents cooling device 4 from including therein an increased temperature due to exhaust heat. Thus, data center 1 can entirely suppress the power consumption including the one for air conditioning.

Embodiment 3

Figures 9A, 9B:
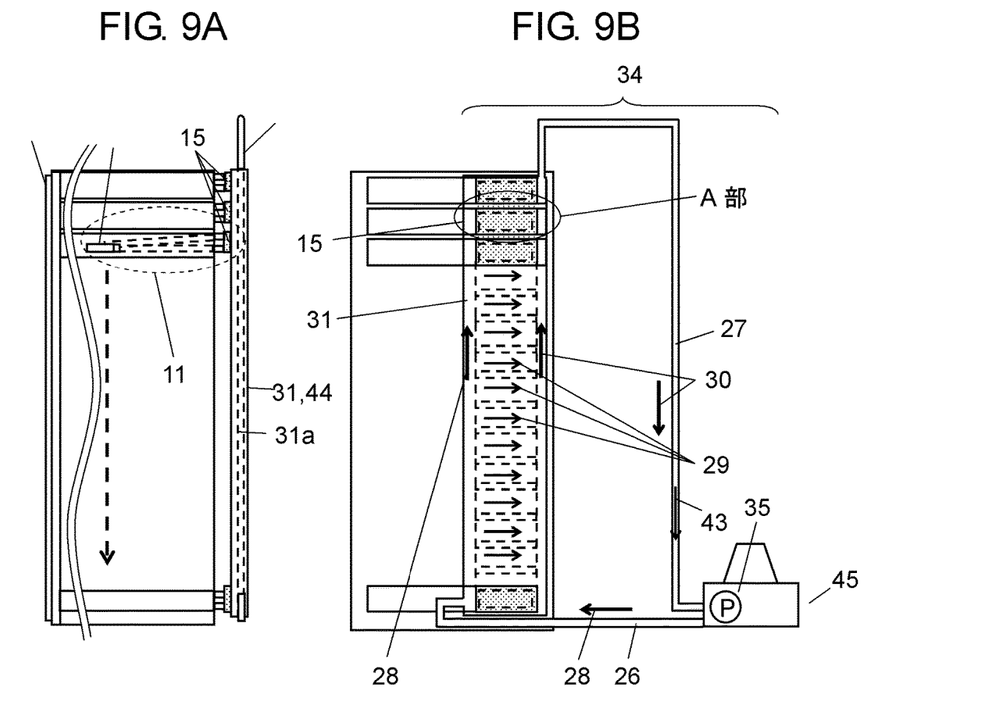
FIG. 9A is a side view illustrating the cooling device for cooling a rack-type server of Embodiment 3 of the present invention.
FIG. 9B is a rear view illustrating the cooling device for cooling a rack-type server.
Figure 9C:
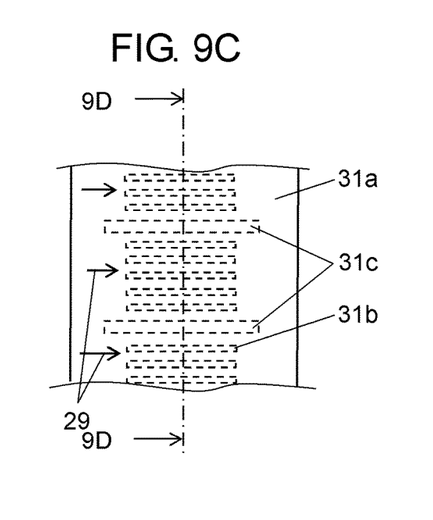
FIG. 9C is an expanded view of the part A of FIG. 9B.
Figure 9D:
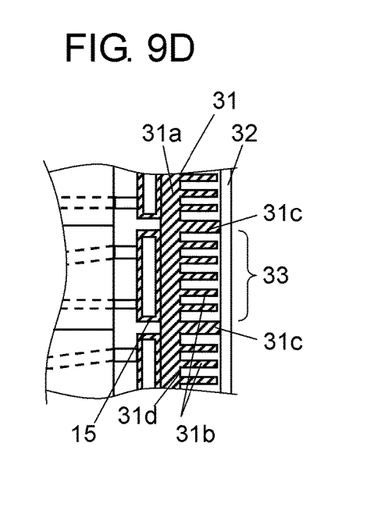
FIG. 9D is a cross-sectional view taken along 9D-9D of FIG. 9C.

In Embodiment 3 of the present invention, the same components as those of Embodiments 1 and 2 will be denoted with the same reference numerals and will not be described further except for the differences therebetween. FIG. 9A is a side view illustrating a cooling device for cooling a rack-type server of Embodiment 3 of the present invention. FIG. 9B is a rear view illustrating the cooling device for cooling a rack-type server. FIG. 9C is an expanded view of the part A in FIG. 9B. FIG. 9D is a cross-sectional view taken along 9D-9D in FIG. 9C.

Embodiment 3 of the present invention is different from Embodiment 1 only in exterior cooling unit 34. As shown in FIG. 9A and FIG. 9B, exterior cooling unit 34 provides a water-cooling cycle composed of outdoor cooling tower 35, outward path water-cooling pipe 26, water-cooling heat exchange unit 31 functioning as heat exchange unit 44, and return path water-cooling pipe 27 that are connected in this order. Specifically, cooling medium 43 is water. Outward path water-cooling pipe 26 and return path water-cooling pipe 27 connect water-cooling heat exchange unit 31 to outdoor cooling tower 35. Water-cooling heat exchange unit 31 is provided at rear face side 46 of housing 40 and includes therein water-cooling heat-receiving plate 31a.

As shown in FIG. 9A to FIG. 9D, outward path cooling water 28 is cooled and sent from outdoor cooling tower 35 and reaches water-cooling heat exchange unit 31 via outward path water-cooling pipe 26 and is circulated in return path water-cooling pipe 27. Water-cooling heat exchange unit 31 comprises water-cooling heat-receiving plate 31a and water-cooling heat-receiving cover 32. Water-cooling heat-receiving plate 31a has water-cooling fins 31b and water-cooling divider plates 31c sandwiching water-cooling fins 31b. Water-cooling heat-receiving plate 31a is configured so that surface 31d opposite to heat dissipation unit 15 has a convexoconcave shape. Water-cooling divider plate 31c is vertically joined to water-cooling heat-receiving cover 32. Heat dissipation unit 15 of interior cooling unit 11 contacts water-cooling/heat-receiving zones 33 individually divided by water-cooling divider plate 31c to provide heat exchange.

Next, the following section will describe the heat exchange in water-cooling/heat-receiving zone 33. As shown in FIG. 9D, water-cooling/heat-receiving zone 33 is configured so that water-cooling heat-receiving plate 31a is vertically joined to water-cooling heat-receiving cover 32. Water-cooling/heat-receiving zones 33 are divided by water-cooling divider plate 31c so as to contact the respective heat dissipation units 15 of interior cooling unit 11. Thus, as shown in FIG. 9B, outward path cooling water 28 flows as heat exchange water 29 in a parallel manner into water-cooling/heat-receiving zones 33, respectively.

Next, upon receiving the heat from heat dissipation unit 15, heat exchange water 29 turns into return path cooling water 30. Return path cooling water 30 is again sent to outdoor cooling tower 35 via return path water-cooling pipe 27. Then, the heat from heat dissipation unit 15 is discharged to external air 45 and return path cooling water 30 is cooled to a level of an external temperature. Return path cooling water 30 cooled by outdoor cooling tower 35 turns into outward path cooling water 28. Then, outward path cooling water 28 is again sent to water-cooling heat exchange unit 31 to deprive the heat of heat dissipation unit 15 of interior cooling unit 11. By the circulation as described above, electronic device 3 is cooled in a continuous manner.

Figure 10:
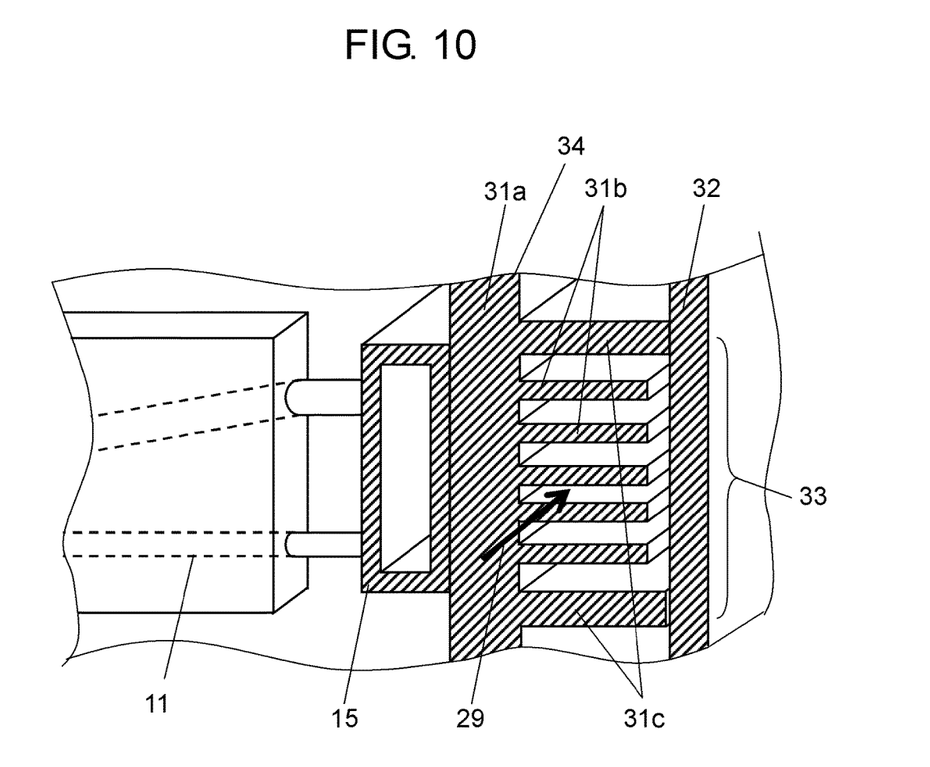
FIG. 10 is a schematic perspective cross-sectional view illustrating a junction part of the interior cooling unit and the exterior cooling unit of the cooling device for cooling a rack-type server of Embodiment 3 of the present invention.

Next, with reference to FIG. 10, the following section will describe a junction part between interior cooling unit 11 and exterior cooling unit 34. FIG. 10 is a schematic perspective cross-sectional view illustrating a junction part between the interior cooling unit and the exterior cooling unit of the cooling device for cooling a rack-type server of Embodiment 3 of the present invention. The heat from heat dissipation unit 15 of interior cooling unit 11 is transmitted to water-cooling heat-receiving plate 31a of exterior cooling unit 34. The heat from heat dissipation unit 15 is dissipated from water-cooling fin 31b provided in water-cooling heat-receiving plate 31a to heat exchange water 29 flowing between water-cooling fins 31b to thereby cool heat dissipation unit 15.

Figure 11:
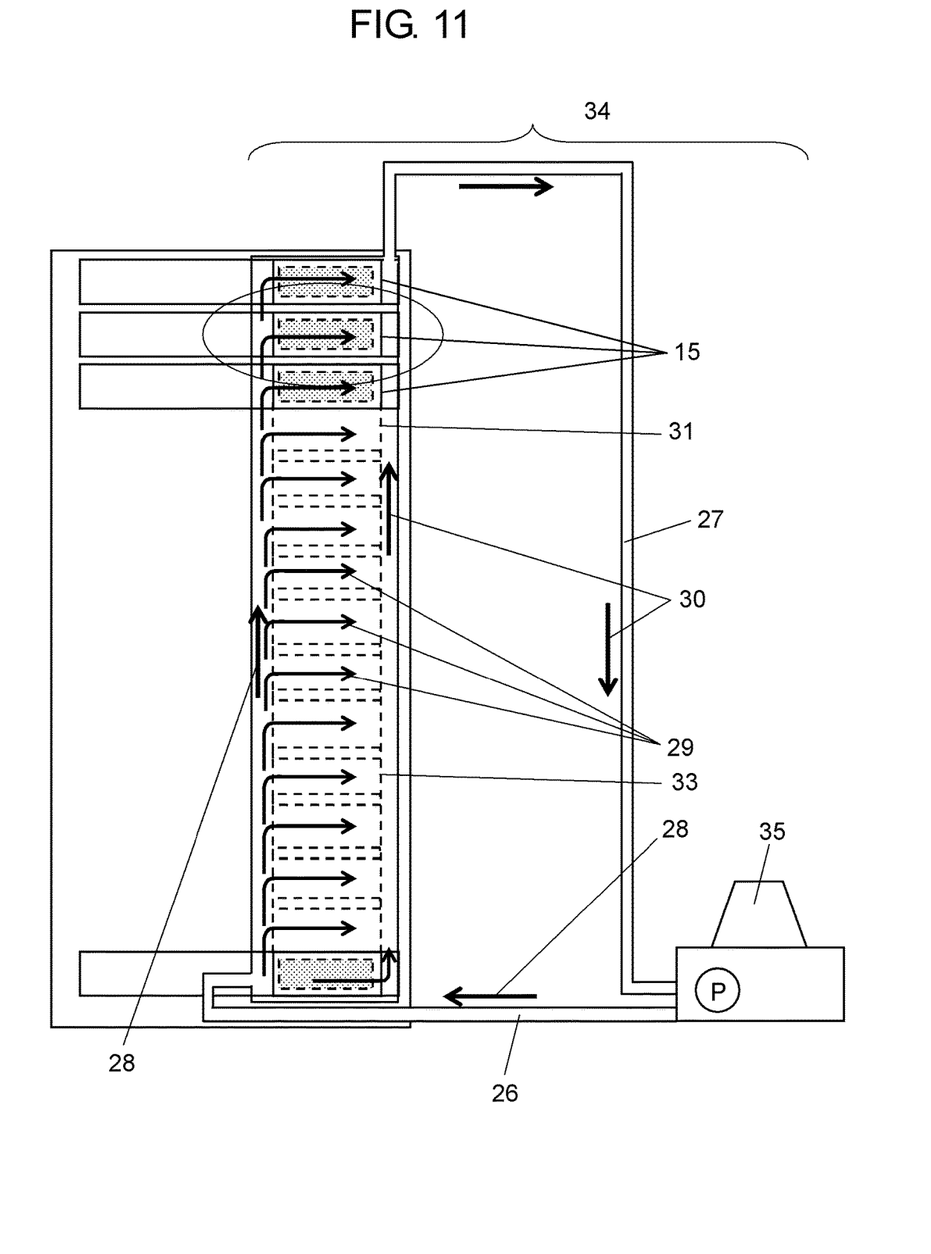
FIG. 11 is a rear view illustrating the flow path statuses of the heat exchange water flowing in parallel into the respective water-cooling/heat-receiving zones from the upper stage to the lower stage of the water-cooling heat exchange unit of the exterior cooling unit of the cooling device for cooling a rack-type server.

FIG. 11 is a rear view illustrating the flow path of the heat exchange water flowing in a parallel manner into the respective water-cooling/heat-receiving zones of the cooling device for cooling a rack-type server of Embodiment 3 of the present invention ranging from the water-cooling heat exchange unit at the upper stage of the exterior cooling unit to the lower stage. The heat exchange water flows into water-cooling/heat-receiving zones 33 respectively at an equal flow rate so that water-cooling/heat-receiving zones 33 respectively have an equal flow path pressure loss. As a result, any stage of water-cooling heat exchange unit 31 provides the same cooling performance.

Figure 12:
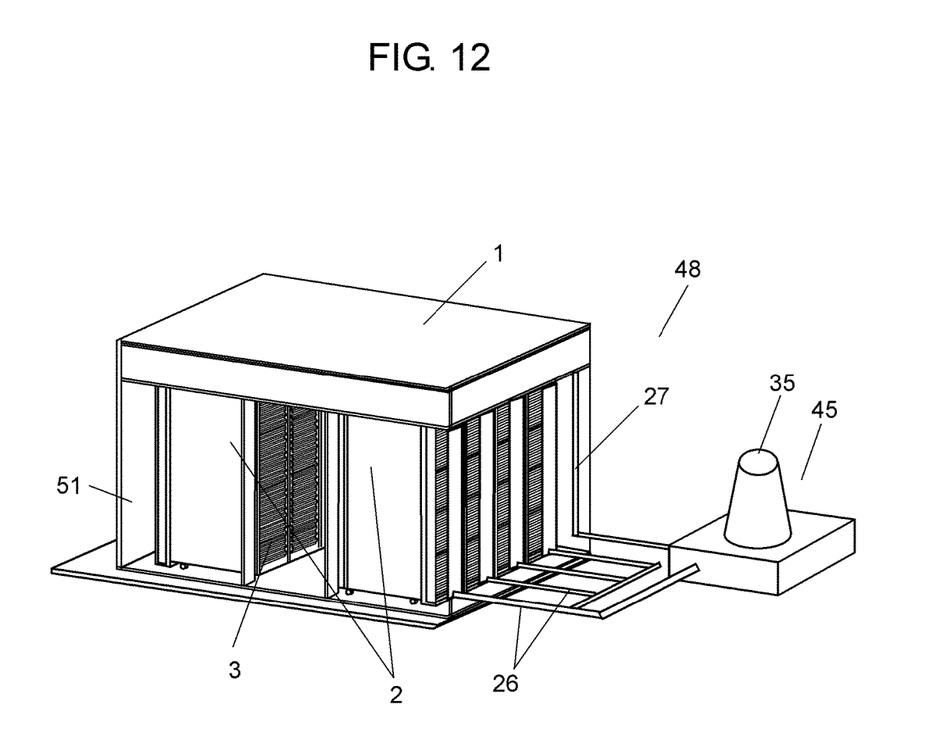
FIG. 12 is a schematic view illustrating a data center of the cooling device for cooling a rack-type server.

FIG. 12 is a schematic view illustrating a data center including a cooling device for cooling a rack-type server of Embodiment 3 of the present invention. As shown in FIG. 12, data center 1 is configured so that rack-type servers 2 are provided and cooling device 48 is provided to cool rack-type server 2. The heat deprived from heat dissipation unit 15 of interior cooling unit 11 shown in FIG. 9A and FIG. 9B is discharged from outdoor cooling tower 35 to external air 45. Thus, as in Embodiments 1 and 2, cooling device 48 can be prevented from including therein an increased temperature due to exhaust heat. Thus, data center 1 can entirely suppress the power consumption including the one for air conditioning.

When exterior cooling unit 34 shown in FIG. 9B uses outdoor cooling tower 35 having a temperature control function, heat dissipation unit 15 of interior cooling unit 11 (junction part) is maintained at a low temperature when compared with Embodiments 1 and 2. As a result, heat-receiving unit 12 also has a lower temperature, thus improving the cooling performance of interior cooling unit 11. Thus, cooling device 48 can be provided that can provide a further-higher heat generation than Embodiments 1 and 2 and that also can be applied to data center 1.

INDUSTRIAL APPLICABILITY

The present invention can be used to cool an indoor-type heat-generating body storage device in which a rack-type storage device includes therein an electronic device.

REFERENCE MARKS IN THE DRAWINGS

1 Data center
1a Ceiling
2 Rack-type server
3 Electronic device
4 and 48 Cooling device
5 and 34 Exterior cooling unit
6 Condenser unit
6a Condenser
7 Evaporator unit
7a Heat-receiving plate
7b Heat-receiving cover
7c and 31d Opposite surface
8 External air suction port
9 External air airflow outlet
10 Air blower
11 Interior cooling unit
12 Heat-receiving unit
13 Outward path pipe
14 Return path pipe
15 Heat dissipation unit
15a Horizontal cross-sectional area
15b Orthogonal cross-sectional area
15c Horizontal width
15d Vertical height
16 Heat dissipation fin
17 Liquid pipe
18 Vapor tubing
19 Electronic component
20 Liquid level
21 and 22 Check valve
26 Outward path water-cooling pipe
27 Return path water-cooling pipe
28 Outward path cooling water
29 Heat exchange water
30 Return path cooling water
31 Water-cooling heat exchange unit
31a Water-cooling heat-receiving plate
31b Water-cooling fin
31c Water-cooling divider plate
32 Water-cooling heat-receiving cover
33 Water-cooling/heat-receiving zone
35 Outdoor cooling tower
40 Housing
41 Working fluid
41a Direction orthogonal to working fluid circulation direction
42 Circulation path
43 Cooling medium
44 Heat exchange unit
45 External air
46 Rear face side
47 Front face side
51 Body space
52 External air ventilation space

The invention claimed is:

1. A cooling device for cooling a rack-type server of which a housing includes a plurality of electronic devices having electronic components, wherein
the cooling device includes an interior cooling unit and an exterior cooling unit,
the interior cooling unit includes:
a heat-receiving unit that transmits heat from the electronic components to working fluid;
a heat dissipation unit that stores the working fluid therein and dissipates heat of the working fluid; and
an outward path pipe and a return path pipe connecting the heat-receiving unit and the heat dissipation unit,
a circulation path is formed in which the working fluid is circulated through the heat-receiving unit, the outward path pipe, the heat dissipation unit and the return path pipe, and a check valve is provided in the return path pipe at a connection side at which return path pipe is connected to the heat-receiving unit, the check valve arranged to prevent the working fluid from circulating from the heat-receiving unit to the heat dissipation unit via the return path pipe and to be opened by hydraulic pressure of the working fluid in the heat dissipation unit, the circulation path not including a pump,
the working fluid is circulated through the circulation path to move the heat from the heat-receiving unit to the heat dissipation unit via the outward path pipe,
the exterior cooling unit has a heat exchange unit abutted on the heat dissipation unit and allows, by a circulated cooling medium, the heat of the working fluid discharged from the heat dissipation unit to be dissipated to external air,
the exterior cooling unit comprises a condenser unit, an evaporator unit functioning as the heat exchange unit, and a liquid pipe and vapor tubing connecting the condenser unit and the evaporator unit,
the condenser unit has a box-like shape that is provided at a ceiling of a data center that includes the rack-type servers, and the condenser unit has a ventilation opening and includes therein a condenser and an air blower,
the evaporator unit is provided at a rear face side of the housing and includes therein a heat-receiving plate, and
the cooling medium is circulated through the evaporator unit, the vapor tubing, the condenser unit, and the liquid pipe.

2. The cooling device for cooling the rack-type server according to claim 1, wherein the heat dissipation unit has a horizontal cross-sectional area that is larger than an orthogonal cross-sectional area orthogonal to a circulation direction of the working fluid in the return path pipe.

3. The cooling device for cooling the rack-type server according to claim 2, wherein the heat dissipation unit has a horizontal width in a horizontal direction larger than a vertical height in a vertical direction.

4. The cooling device for cooling the rack-type server according to claim 2, wherein the heat dissipation unit includes therein heat dissipation fins.

5. The cooling device for cooling the rack-type server according to claim 1, wherein the heat-receiving plate has a surface having a convexoconcave shape opposite to the heat dissipation unit.

6. The cooling device for cooling the rack-type server according to claim 1, wherein the liquid pipe includes a check valve.

7. A data center wherein
the data center is divided into an external air ventilation space as an upper part and a body space as a lower part,
the rack-type server is provided in the body space,
the data center includes the cooling device for cooling the rack-type server according to claim 1, and
the condenser is provided in the external air ventilation space.

8. A cooling device for cooling a rack-type server of which a housing includes a plurality of electronic devices having electronic components, wherein
the cooling device includes an interior cooling unit and an exterior cooling unit,
the interior cooling unit includes:
a heat-receiving unit that transmits heat from the electronic components to working fluid;
a heat dissipation unit including a plurality of heat dissipation fins for dissipating heat of the working fluid stored therein in a liquefied form; and
an outward path pipe and a return path pipe connecting the heat-receiving unit and the heat dissipation unit,
a circulation path is formed in which the working fluid is circulated through the heat-receiving unit, the outward path pipe, the heat dissipation unit and the return path pipe, and a check valve is provided in a part of the circulation path from the heat dissipation unit to the heat-receiving unit, the check valve arranged to be opened by hydraulic pressure of the working fluid in the heat dissipation unit, the circulation path not including a pump,
the working fluid is circulated through the circulation path to move the heat from the heat-receiving unit to the heat dissipation unit, and
the exterior cooling unit has a heat exchange unit abutted on the heat dissipation unit and allows, by a circulated cooling medium, the heat of the working fluid discharged from the heat dissipation unit to be dissipated to external air,
the exterior cooling unit comprises a condenser unit, an evaporator unit functioning as the heat exchange unit, and a liquid pipe and vapor tubing connecting the condenser unit and the evaporator unit,
the condenser unit has a box-like shape that is provided at a ceiling of a data center that includes the rack-type servers, and the condenser unit has a ventilation opening and includes therein a condenser and an air blower,
the evaporator unit is provided at a rear face side of the housing and includes therein a heat-receiving plate, and
the cooling medium is circulated through the evaporator unit, the vapor tubing, the condenser unit, and the liquid pipe.

9. The cooling device for cooling the rack-type server according to claim 8, wherein a height of each of the plurality of heat dissipation fins increasingly reduces toward a connecting port of outward path pipe.

10. The cooling device for cooling the rack-type server according to claim 8, wherein each of the plurality of heat dissipation fins includes a plurality of divided portion which are spaced in a height direction.

11. The cooling device for cooling the rack-type server according to claim 8, wherein all of the plurality of heat dissipation fins except for a center one are arranged in an inclined manner to be symmetric about the center one.

* * * * *